(12) United States Patent
Shih et al.

(10) Patent No.: US 6,456,482 B1
(45) Date of Patent: Sep. 24, 2002

(54) MICROELECTRONIC CAPACITOR WITH CAPACITOR PLATE LAYER FORMED OF TUNGSTEN RICH TUNGSTEN OXIDE MATERIAL

(75) Inventors: Wong-Cheng Shih, Kaohsiung; Tai Bor Wu, Hsin-Chu; Chich Shang Chang, Ba-Teh, all of (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/947,050

(22) Filed: Sep. 5, 2001

(51) Int. Cl.$^7$ ............................................... H01G 4/008
(52) U.S. Cl. .................... 361/305; 361/303; 361/321.5; 361/312; 438/240; 257/306; 257/307
(58) Field of Search ................................. 361/305, 320, 361/275.1, 311, 313, 321.5, 303, 312, 321.1; 257/307, 306; 438/240, 381

(56) References Cited

U.S. PATENT DOCUMENTS

| | | | | |
|---|---|---|---|---|
| 4,266,990 A | * | 5/1981 | Momma et al. | 148/189 |
| 5,110,752 A | * | 5/1992 | Lu | 437/47 |
| 5,262,662 A | * | 11/1993 | Gonzalez et al. | 257/307 |
| 5,317,190 A | * | 5/1994 | Fleischman et al. | 257/743 |
| 6,072,689 A | * | 6/2000 | Kirlin | 361/311 |
| 6,150,208 A | * | 11/2000 | Deboer et al. | 438/240 |
| 6,207,528 B1 | | 3/2001 | Lee | |
| 6,303,972 B1 | * | 10/2001 | Agarwal | 257/532 |

* cited by examiner

Primary Examiner—Dean A. Reichard
Assistant Examiner—Nguyen Ha
(74) Attorney, Agent, or Firm—Tung & Associates

(57) ABSTRACT

Within both a method for forming a capacitor and a capacitor formed employing the method, there is employed for forming at least part of at least one of a first capacitor plate and a second capacitor plate a tungsten rich tungsten oxide material having a tungsten:oxygen atomic ratio of from about 5:1 to about 1:1. By forming the at least part of the at least one of the first capacitor plate and the second capacitor plate of the foregoing tungsten rich tungsten oxide material, the capacitor is formed with attenuated leakage current density.

15 Claims, 2 Drawing Sheets

MICROELECTRONIC CAPACITOR WITH CAPACITOR PLATE LAYER FORMED OF TUNGSTEN RICH TUNGSTEN OXIDE MATERIAL

BACKGROUND OF THE INVENTION

1. Field of the Invention

The present invention relates generally to capacitor structures formed within microelectronic fabrications. More particularly, the present invention relates to capacitor structures formed with enhanced performance within microelectronic fabrications.

2. Description of the Related Art

In addition to the use and fabrication of transistor devices as switching devices within microelectronic fabrications, it is also common in the art microelectronic fabrication to fabricate capacitor devices for use in conjunction with signal processing functions and data storage functions within microelectronic fabrications.

While capacitor devices are thus common in the art of microelectronic fabrication and often essential in the art of microelectronic fabrication, capacitor devices are nonetheless not entirely without problems in the art of microelectronic fabrication. In that regard, it is often difficult to form, with decreased dimensions within microelectronic fabrications, capacitor devices with enhanced performance.

It is thus desirable in the art of microelectronic fabrication to form within microelectronic fabrications capacitor devices with enhanced performance.

It is towards the foregoing object that the present invention is directed.

Various methods and materials have been disclosed within the art of microelectronic fabrication for forming capacitor devices and capacitor structures with desirable properties.

Included among the methods and materials, but not limited among the methods and materials, are methods and materials disclosed within Lee, in U.S. Pat. No. 6,207,528 (a method for forming a capacitor device with enhanced capacitance by forming a capacitor dielectric layer within the capacitor device of a tantalum oxide/aluminum oxide composite dielectric material, rather than a tantalum oxide dielectric material).

Desirable in the art of microelectronic fabrication are additional methods and materials which may be employed within the art of microelectronic fabrication for forming capacitor devices with enhanced performance.

It is towards the foregoing object that the present invention is directed.

SUMMARY OF THE INVENTION

A first object of the present invention is to provide a method for forming a capacitor device within a microelectronic fabrication.

A second object of the present invention is to provide a method in accord with the first object of the present invention, wherein the capacitor device is formed with enhanced performance.

A third object of the present invention is to provide a method in accord with the first object of the present invention and the second object of the present invention, wherein the method is readily commercially implemented.

In accord with the objects of the present invention, there is provided by the present invention a capacitor device and a method for forming the capacitor device.

To practice the method of the present invention, there is first provided a substrate. There is then formed over the substrate a first capacitor plate. There is then formed upon the first capacitor plate a capacitor dielectric layer. Finally, there is then formed upon the capacitor dielectric layer a second capacitor plate, wherein at least one of the first capacitor plate and the second capacitor plate is formed at least in part of a tungsten rich tungsten oxide material having a tungsten:oxygen atomic ratio of from about 5:1 to about 1:1.

The method for forming the capacitor device in accord with the present invention contemplates the capacitor device formed in accord with the method for forming the capacitor device.

The present invention provides a method for forming a capacitor device within a microelectronic fabrication, and the capacitor device formed in accord with the method for forming the capacitor device, wherein the capacitor device is formed with enhanced performance.

The present invention realizes the foregoing object within the context of forming an otherwise generally conventional capacitor device comprising a first capacitor plate separated from a second capacitor plate by a capacitor dielectric layer, by forming at least one of the first capacitor plate and the second capacitor plate at least in part of a tungsten rich tungsten oxide material having a tungsten:oxygen atomic ratio of from about 5:1 to about 1:1.

Within the context of the present invention, the tungsten rich tungsten oxide material provides the capacitor device with an attenuated leakage current density.

The method of the present invention is readily commercially implemented.

As will be illustrated in greater detail within the context of the Description of the Preferred Embodiment, as set forth below, a capacitor device fabricated in accord with the present invention may be formed employing methods and materials as are generally known in the art of microelectronic fabrication, but formed with specific process limitations which provide specific materials limitations to provide a capacitor device in accord with the present invention. Since it is thus a series of process limitations in accord with the present invention which provides a series of materials limitations in accord with the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Although the preferred embodiment of the present invention illustrates the present invention within the context of forming, with attenuated leakage current density, a storage capacitor within a dynamic random access memory (DRAM) cell within a semiconductor integrated circuit microelectronic fabrication, the present invention may nonetheless be employed for forming, with attenuated leakage current density, various types of capacitors within various types of microelectronic fabrications. In that regard, the present invention may be employed for forming capacitors including but not limited to data storage capacitors and signal processing capacitors. Similarly, such capacitors may be employed within microelectronic fabrications selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
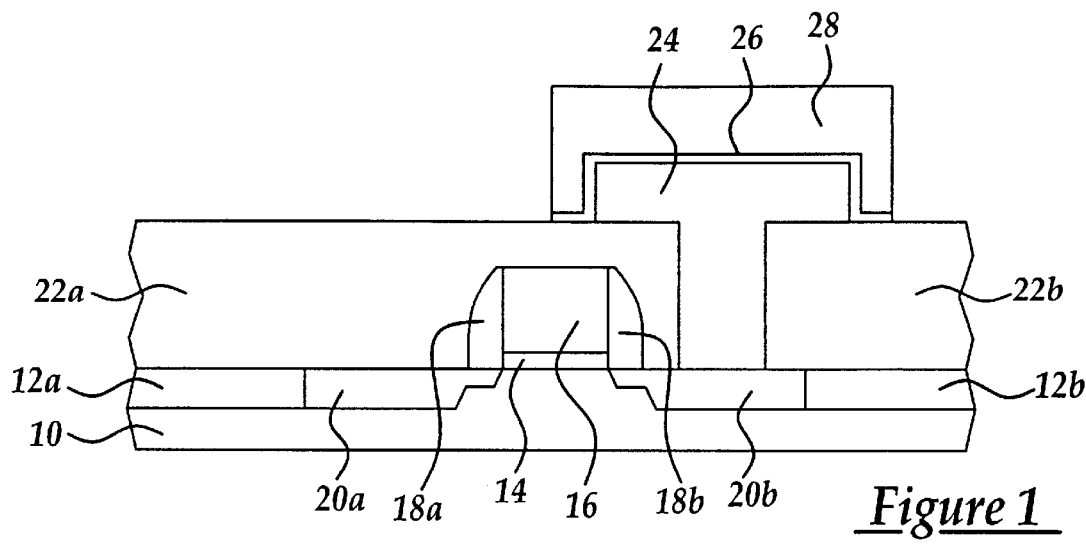
FIG. 1 shows a schematic cross-sectional diagram of a dynamic random access memory (DRAM) semiconductor integrated circuit microelectronic fabrication having formed therein a capacitor device which may be formed in accord with the present invention.

Referring now to FIG. 1, there is shown a schematic cross-sectional diagram of a dynamic random access memory (DRAM) semiconductor integrated circuit microelectronic fabrication having formed therein a capacitor device structure which may be formed in accord with the present invention.

Shown in FIG. 1 is a semiconductor substrate 10 having formed within an upon its surface a pair of isolation regions 12a and 12b which define an active region of the semiconductor substrate 10.

Within the preferred embodiment of the present invention, the semiconductor substrate 10 and the isolation regions 12a and 12b are conventional in the art of semiconductor integrated circuit microelectronic fabrication. In that regard, and although the semiconductor substrate 10 may be formed from any of several semiconductor materials, including but not limited to silicon semiconductor materials, germanium semiconductor materials, silicon germanium semiconductor materials, and compound semiconductor materials, the semiconductor substrate 10 is typically and preferably a (100) silicon semiconductor substrate having an appropriate dopant concentration. Similarly, although the isolation regions 12a and 12b may be formed employing any of several isolation methods and isolation materials, the pair of isolation regions 12a and 12b is typically and preferably formed as a pair of shallow trench isolation (STI) regions formed at least in part of a silicon oxide shallow trench isolation material.

Shown also within the schematic cross-sectional diagram of FIG. 1 formed within and upon the active region of the semiconductor substrate 10 is a series of structures which comprises a field effect transistor (FET) device. The series of structures which comprises the field effect transistor (FET) device includes: (1) a gate dielectric layer 14 formed upon the active region of the semiconductor substrate 10; (2) a gate electrode 16 formed and aligned upon the gate dielectric layer 14; (3) a pair of spacer layers 18a and 18b formed adjoining a pair of opposite edges of the gate dielectric layer 14 and the gate electrode 16; and (4) a pair of source/drain regions 20a and 20b formed into the active region of the semiconductor substrate at areas not covered by the gate dielectric layer 14 and the gate electrode 16. Each of the foregoing series of structures which comprises the field effect transistor (FET) device may be formed employing methods, materials and dimensions as are otherwise conventional in the art of semiconductor integrated circuit microelectronic fabrication.

There is also shown within the schematic cross-sectional diagram of FIG. 1 formed passivating in part the series of structures which comprises the field effect transistor (FET) device a pair of patterned pre-metal dielectric (PMD) layers 22a and 22b which forms a contact via which leaves exposed a portion of the source/drain region 20b.

Within the preferred embodiment of the present invention, the pair of patterned planarized pre-metal dielectric (PMD) layers 22a and 22b may also be formed employing methods, materials and dimensions as are conventional in the art of semiconductor integrated circuit microelectronic fabrication, but will typically and preferably be formed at least in part of a silicon oxide dielectric material, and formed to a thickness of from about 1.8 to about 4 microns to leave exposed the portion of the source/drain region 20b which forms a contact region.

Finally, there is also shown within the schematic cross-sectional diagram of FIG. 1 formed contacting the portion of the source/drain region 20b exposed within the contact via defined by the pair of patterned planarized pre-metal dielectric (PMD) layers 22a and 22b a capacitor device structure which comprises: (1) a first capacitor plate layer 24 formed into the contact via and contacting the exposed portion of the source/drain region 20b; (2) a capacitor dielectric layer 26 formed upon the first capacitor plate layer 24; and (3) a second capacitor plate layer 28 formed upon the capacitor dielectric layer 26.

Within the preferred embodiment of the present invention with respect to the capacitor dielectric layer 26, the capacitor dielectric layer 26 may be formed employing capacitor dielectric materials as are conventional or unconventional in the art of semiconductor integrated circuit microelectronic fabrication, including but not limited to generally lower dielectric constant dielectric materials (i.e., having a dielectric constant in a range of from about 4 to about 8) such as but not limited to silicon oxide dielectric materials, silicon nitride dielectric materials and silicon oxynitride dielectric materials and generally higher dielectric constant dielectric materials (i.e., having a dielectric constant in a range of from about 20 to about 1000) such as but not limited to barium-strontium-titanate (BST) dielectric materials, lead-zirconate-titanate (PZT) dielectric materials and tantalum oxide dielectric materials, such as are disclosed in part in greater detail within the reference cited within the Description of the Related Art, the disclosure of which is incorporated herein fully by reference. Typically and preferably, the capacitor dielectric layer 26 is formed to a thickness of from about 30 to about 250 angstroms from a tantalum oxide dielectric material.

Within the preferred embodiment of the present invention with respect to the first capacitor plate layer 24 and the second capacitor plate layer 28, it is at least in part a material from which is formed the first capacitor plate layer 24 and the second capacitor plate layer 28 which provides at least in part the present invention.

In that regard, and within the context of the present invention, at least one of the first capacitor plate layer 24 and the second capacitor plate layer 28 is formed at least in part of a tungsten rich tungsten oxide material having a tungsten:oxygen atomic ratio of from about 5:1 to about 1:1, more preferably from about 4:1 to about 2:1 and yet more preferably from about 3.5:1 to about 2.5:1. Most preferably at least a portion of each of the first capacitor plate layer 24 and the second capacitor plate layer 28 (and preferably at least a portion of the first capacitor plate layer 24 and the second capacitor plate layer 28 which contacts the capacitor dielectric layer 26), is formed of the tungsten rich tungsten oxide material of the above atomic ratio composition limitations. Typically and preferably, each of the first capacitor plate layer 24 and the second capacitor plate layer is formed to a thickness of from about 200 to about 1500 angstroms. Within the present invention, the terminology "tungsten rich tungsten oxide" is intended as relative descriptive terminology in comparison with a conventional tungsten tri-oxide material (i.e., $WO_3$).

Although other methods, such as but not limited to direct non-reactive physical vapor deposition (PVD) sputtering methods and chemical vapor deposition (CVD) methods, are not precluded, in order to form a tungsten rich tungsten oxide material for forming a capacitor plate layer in accord with the present invention, the tungsten rich tungsten oxide material is formed via reactive sputtering of a tungsten metal target in an argon and oxygen sputtering gas atmosphere having an argon:oxygen (i.e., Ar:O2) volume ratio of from about 95:5 to about 80:20, more preferably from about 90:10 to about 85:15. Typically and preferably, the reactive sputtering method also employs: (1) a reactor chamber pressure of from about 1 mTorr to about 20 mTorr; (2) a bias sputtering power of from about 100 to about 300 watts; and (3) a substrate temperature of from about 300 to about 400 degrees centigrade, in addition to the argon:oxygen volume ratio of from about 95:5 to about 80:20.

Upon forming the semiconductor integrated circuit microelectronic fabrication whose schematic cross-sectional diagram is illustrated in FIG. 1, there is formed a semiconductor integrated circuit microelectronic fabrication having formed therein a capacitor device with enhanced performance and in particular with attenuated leakage current density. The capacitor device realizes the foregoing objects by being formed with capacitor plates formed at least in part of a tungsten rich tungsten oxide material.

EXAMPLES 1–3

Three semiconductor substrates were obtained and there was formed over each of the three semiconductor substrates a blanket dielectric layer formed of a silicon oxide dielectric material formed to a thickness of about 100 angstroms. Formed upon the series of three silicon oxide dielectric material layers was a series of three tungsten oxide layers formed employing a reactive sputtering method in turn employing a tungsten target in conjunction with an argon and oxygen sputtering gas mixture. The reactive sputtering method also employed: (1) a reactor chamber pressure of about 5 mTorr; (2) a bias sputtering power of about 200 watts; (3) a semiconductor substrate temperature of about 350 degrees centigrade. With respect to the three semiconductor substrates, the reactive sputtering method also employed an argon:oxygen volume ratio of either 90:10, 80:20 or 70:30.

Figure 2:
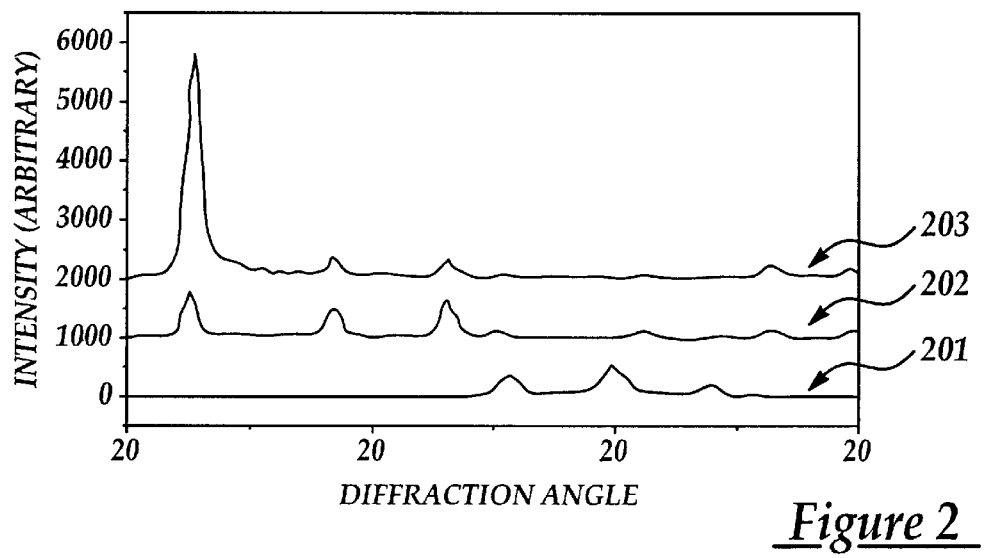
FIG. 2 shows a graph of Intensity versus Diffraction Angle for an x-ray diffraction (XRD) analysis of tungsten oxide layers sputter deposited employing various conditions.

After forming the three tungsten oxide layers over the series of three semiconductor substrates, there was then obtained an x-ray diffraction (XPD) spectrum for each of the three tungsten oxide layers, while employing x-ray diffraction (XRD) methods as are conventional in the art of microelectronic fabrication. The results of the x-ray diffraction (XRD) analyses are illustrated within the graph of FIG. 2. Illustrated in FIG. 2 is a graph of Intensity versus Diffraction Angle for an x-ray diffraction (XRD) analysis of the three tungsten oxide layers formed over the three semiconductor substrates. Within FIG. 2: (1) the curve which corresponds with reference numeral 201 corresponds with the tungsten oxide layer reactively sputtered within the 90:10 argon:oxygen atmosphere; (2) the curve which corresponds with reference numeral 202 corresponds with the tungsten oxide layer reactively sputtered within the 80:20 argon:oxygen atmosphere; and (3) the curve which corresponds with reference numeral 203 corresponds with the tungsten oxide layer reactively sputtered within the 70:30 argon:oxygen atmosphere.

As is illustrated within the graph of FIG. 2, and with respect to the curve which corresponds with reference numeral 201, the x-ray diffraction peaks at 36, 40 and 44 degrees diffraction angle are representative of a tri-tungsten oxide tungsten rich tungsten oxide material (i.e., $W_3O$). Similarly, and with respect to the curve which corresponds with reference numeral 203, the x-ray diffraction peaks at 23, 28, 34 and 46 are representative of a conventional tungsten trioxide material ($WO_3$). Within the context of the present invention, it is believed that the tri-tungsten oxide tungsten rich tungsten oxide material (which is most preferred within the present invention) provides an attenuated leakage current density and thus an enhanced performance of capacitor plate layers formed employing that material.

Further in accord with the present invention, it is anticipated that within an argon:oxygen volume ratio of from about 95:5 to about 80:20 in accord with the above limitations that there is provided sufficient tri-tungsten oxide tungsten rich tungsten oxide material to provide a capacitor plate layer with enhanced performance in accord with the present invention.

EXAMPLES 4–10

Figure 3:
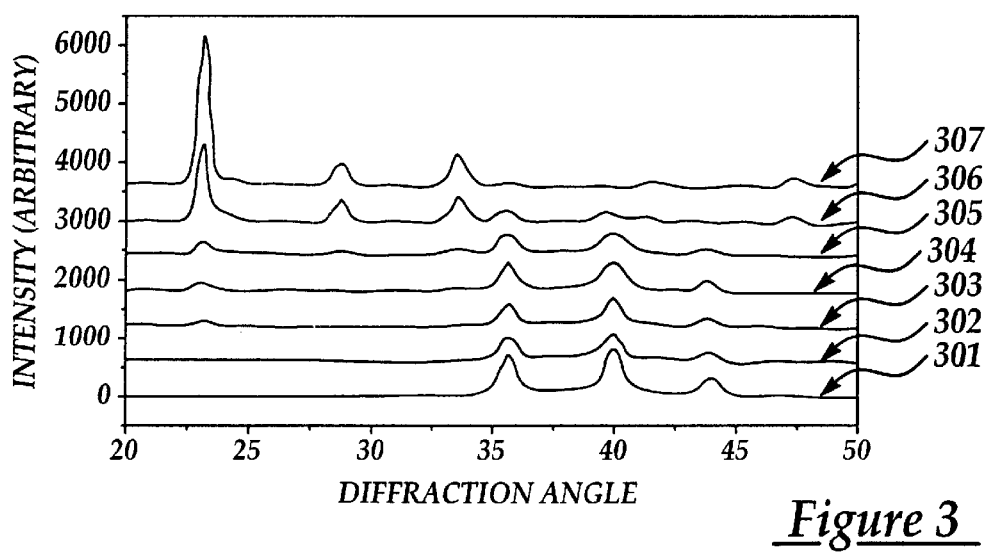
FIG. 3 shows a graph of Intensity versus Diffraction Angle for an x-ray diffraction (XRD) analysis illustrating thermal oxidation of a tungsten rich tungsten oxide layer.

Referring now to FIG. 3, there is shown a graph of Intensity versus Diffraction Angle for an x-ray diffraction (XRD) analysis of thermal oxidation of a tri-tungsten oxide tungsten rich tungsten oxide layer formed in accord with Examples 1–3.

As is illustrated within the graph of FIG. 3, the curve which corresponds with reference numeral 301 corresponds with the curve which corresponds with reference numeral 201 within the graph of FIG. 2. Both of those curves correspond with a tri-tungsten oxide tungsten rich tungsten oxide material reactively sputter deposited within an argon:oxygen atmosphere at an argon:oxygen sputtering gas volume ratio of 90:10.

The remaining curves 302–307 within the graph of FIG. 3 correspond with a rapid thermal oxidation of the tri-tungsten oxide tungsten rich tungsten oxide material within a 100 percent oxygen atmosphere for a time period of 60 seconds, for a sequence of peak temperatures starting at 400 degrees centigrade (curve 302) and ending at 650 degrees centigrade (curve 307), with 50 degree centigrade intervals. As is illustrated within the graph of FIG. 3, the tri-tungsten oxide tungsten rich tungsten oxide material shows considerable thermal stability up to about 550 degrees centigrade (curve 305), but above that temperature it thermally oxidizes to a conventional tungsten trioxide material.

EXAMPLES 11–13

There was formed a planar capacitor while employing for a first (i.e., lower) capacitor plate layer a tungsten rich tungsten oxide material in accord with curve 201 of FIG. 2 or curve 301 of FIG. 3. The first capacitor plate layer had formed thereupon a capacitor dielectric layer formed of a tantalum oxide dielectric material, also formed employing a chemical vapor deposition (CVD) method. The capacitor dielectric layer was formed to a thickness of about 200 angstroms upon the first capacitor plate. The capacitor dielectric layer had formed thereupon a second (i.e., upper) capacitor plate layer formed of a tungsten layer formed to a thickness of about 1000 angstroms.

For comparison purposes, there was also formed an otherwise equivalent planar capacitor (with respect to dimensions and remaining materials) but formed with a first capacitor plate formed of a titanium nitride material, rather than a tungsten rich tungsten oxide material.

For comparison purposes, there was similarly also formed an otherwise equivalent capacitor (with respect to dimensions and remaining materials) but formed with a first capacitor plate formed of a tungsten material, rather than a tungsten rich tungsten oxide material.

Figure 4:
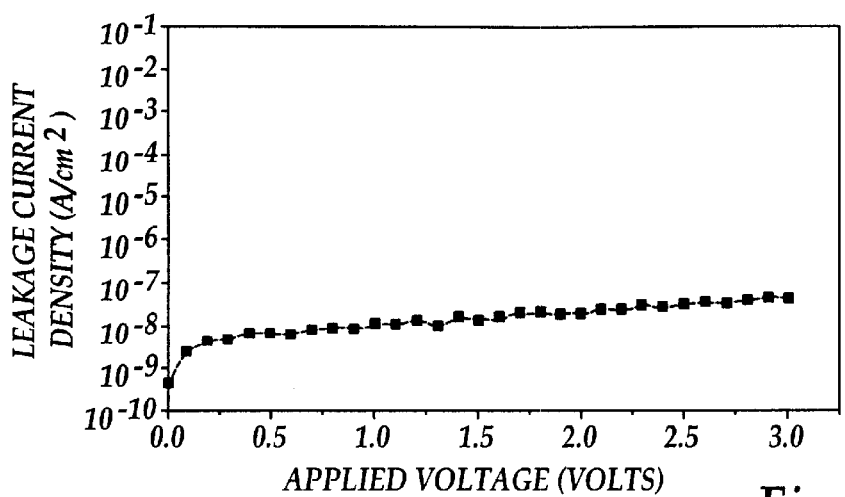
FIG. 4 shows a graph of Leakage Current Density versus Applied Voltage for a capacitor formed in accord with the present invention.

For each of the three capacitors there was then measured a leakage current density as a function of applied capacitor voltage. The results of the measurements are shown within the graphs of FIG. 4 to FIG. 6, where: (1) FIG. 4 shows a graph of Leakage Current Density versus Applied Voltage for the capacitor having the first capacitor plate formed of the tungsten rich tungsten oxide material; (2) FIG. 5 shows a graph of Leakage Current Density versus Applied Voltage for the capacitor having the first capacitor plate formed of the tungsten nitride material; and (3) FIG. 6 shows a graph of Leakage Current Density versus Applied Voltage for the capacitor having the first capacitor plate formed of the tungsten material.

Figure 5:
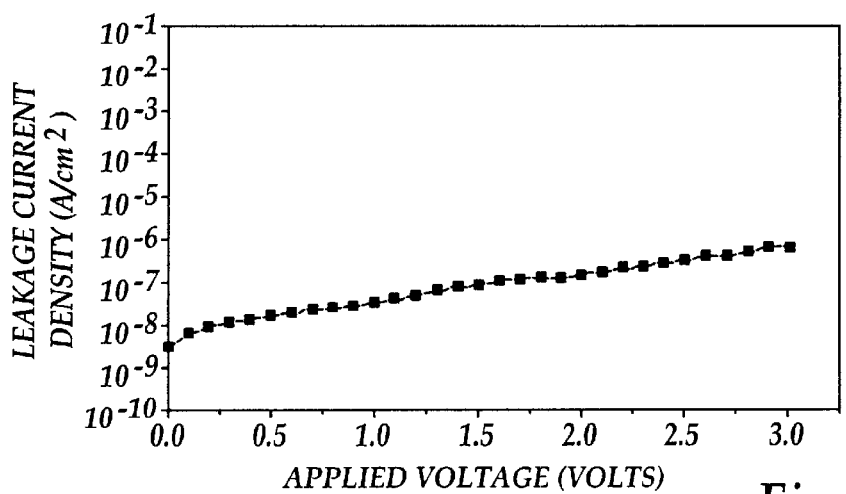
FIG. 5 shows a graph of Leakage Current Density versus Applied Voltage for a capacitor formed employing a tungsten nitride capacitor plate layer.
Figure 6:
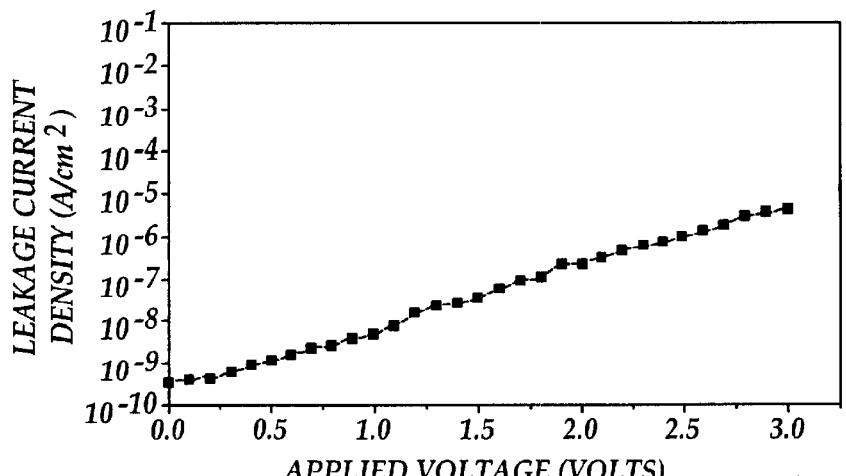
FIG. 6 shows a graph of Leakage Current Density versus Applied Voltage for a capacitor formed employing a tungsten capacitor plate layer.

As is seen from review of the graphs of FIG. 4 to FIG. 6, the capacitor having the first capacitor plate formed of the tungsten rich tungsten oxide material has an attenuated leakage current density in comparison with an otherwise equivalent capacitor having a first capacitor plate formed of the tungsten nitride material or the tungsten material.

As is understood by a person skilled in the art, the preferred embodiment and examples of the present invention are illustrative of the present invention rather than limiting of the present invention. Revisions and modifications may be made to methods, materials, structures and dimensions through which is formed a capacitor device in accord with the preferred embodiments and examples of the present invention while still providing a capacitor device in accord with the present invention, and a method for fabrication thereof, further in accord with the accompanying claims.

What is claimed is:

1. A capacitor comprising:
    a substrate;
    a first capacitor plate formed over the substrate;
    a capacitor dielectric layer formed upon the first capacitor plate; and
    a second capacitor plate formed upon the capacitor dielectric layer, wherein at least one of the first capacitor plate and the second capacitor plate is formed at least in part of a tungsten rich tungsten oxide material having a tungsten:oxygen atomic ratio of from about 5:1 to about 1:1.

2. The capacitor of claim 1 wherein the first capacitor plate and the second capacitor plate are each formed to a thickness of from about 200 to about 1500 angstroms.

3. The capacitor of claim 1 wherein the capacitor dielectric layer is formed from a dielectric material selected from the group consisting of silicon oxide dielectric materials, silicon nitride dielectric materials, silicon oxynitride dielectric materials, barium-strontium-titanate dielectric materials, lead-zirconium-titanate dielectric materials and tantalum oxide dielectric materials.

4. The capacitor of claim 1 wherein the capacitor dielectric layer is formed to a thickness of from about 30 to about 250 angstroms.

5. A capacitor comprising:
    a substrate;
    a first capacitor plate formed over the substrate;
    a capacitor dielectric layer formed of a tantalum oxide dielectric material formed upon the first capacitor plate; and
    a second capacitor plate formed upon the capacitor dielectric layer, wherein at least one of the first capacitor plate and the second capacitor plate is formed at least in part of a tungsten rich tungsten oxide material having a tungsten:oxygen atomic ratio of from about 5:1 to about 1:1.

6. The capacitor of claim 5 wherein the first capacitor plate and the second capacitor plate are each formed to a thickness of from about 200 to about 1500 angstroms.

7. The capacitor of claim 5 wherein the capacitor dielectric layer is formed to a thickness of from about 30 to about 250 angstroms.

8. A method for forming a capacitor comprising:
    providing a substrate;
    forming over the substrate a first capacitor plate;
    forming upon the first capacitor plate a capacitor dielectric layer; and
    forming upon the capacitor dielectric layer a second capacitor plate, wherein at least one of the first capacitor plate and the second capacitor plate is formed at least in part of a tungsten rich tungsten oxide material having a tungsten:oxygen atomic ratio of from about 5:1 to about 1:1.

9. The method of claim 8 wherein the first capacitor plate and the second capacitor plate are each formed to a thickness of from about 200 to about 1500 angstroms.

10. The method of claim 8 wherein the capacitor dielectric layer is formed from a dielectric material selected from the group consisting of silicon oxide dielectric materials, silicon nitride dielectric materials, silicon oxynitride dielectric materials, barium-strontium-titanate dielectric materials, lead-zirconium-titanate dielectric materials and tantalum oxide dielectric materials.

11. The method of claim 8 wherein the capacitor dielectric layer is formed to a thickness of from about 30 to about 250 angstroms.

12. A method for forming a capacitor comprising:
    providing a substrate;
    forming over the substrate a first capacitor plate;
    forming upon the first capacitor plate a capacitor dielectric layer; and
    forming upon the capacitor dielectric layer a second capacitor plate, wherein at least one of the first capacitor plate and the second capacitor plate is formed at least in part of a tungsten rich tungsten oxide material having a tungsten:oxygen atomic ratio of from about 5:1 to about 1:1 formed employing a reactive sputtering method of a tungsten target material with an argon: oxygen sputtering gas mixture at a volume ratio of about 95:5 to about 80:20.

13. The method of claim 12 wherein the first capacitor plate and the second capacitor plate are each formed to a thickness of from about 200 to about 1500 angstroms.

14. The method of claim 12 wherein the capacitor dielectric layer is formed from a dielectric material selected from the group consisting of silicon oxide dielectric materials, silicon nitride dielectric materials, silicon oxynitride dielectric materials, barium-strontium-titanate dielectric materials, lead-zirconium-titanate dielectric materials and tantalum oxide dielectric materials.

15. The method of claim 12 wherein the capacitor dielectric layer is formed to a thickness of from about 30 to about 250 angstroms.

* * * * *